(12) United States Patent
Neogi et al.

(10) Patent No.: US 7,220,624 B2
(45) Date of Patent: May 22, 2007

(54) WINDOWED PACKAGE FOR ELECTRONIC CIRCUITRY

(75) Inventors: Sudipto Neogi, San Jose, CA (US); Biswajit Sur, San Jose, CA (US); Boon Seng Tan, Penang (MY); Chris Rumer, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/171,588

(22) Filed: Jun. 29, 2005

(65) Prior Publication Data
US 2005/0253254 A1 Nov. 17, 2005

Related U.S. Application Data

(62) Division of application No. 09/751,214, filed on Dec. 29, 2000.

(51) Int. Cl.
H01L 21/44 (2006.01)
H01L 21/48 (2006.01)
H01L 21/50 (2006.01)

(52) U.S. Cl. .................... 438/125; 438/126

(58) Field of Classification Search ............ 438/125, 438/126; 257/704, 710
See application file for complete search history.

(56) References Cited

U.S. PATENT DOCUMENTS 4,961,106 A * 10/1990 Butt et al. ............ 257/710
5,081,327 A    1/1992 Graham et al.
5,950,074 A *  9/1999 Glenn et al. ......... 438/121
6,136,128 A   10/2000 Chung
6,215,180 B1   4/2001 Chen et al.
6,232,652 B1 * 5/2001 Matsushima ......... 257/667
6,410,981 B2   6/2002 Tao

FOREIGN PATENT DOCUMENTS

| JP | 63029555 | 7/1986 |
| JP | 61256656 | 11/1986 |
| JP | 63084051 | 4/1988 |
| JP | 04083363 | 7/1990 |
| JP | 06140523 | 10/1992 |
| JP | 06232284 | 8/1994 |
| JP | 20000349178 | 12/2000 |

OTHER PUBLICATIONS

Harper, Electronic Packaging and Interconnection Handbook, 1991, McGraw-Hill, pp. 1.9-10.
Merriam Webster's Collegiate Dictionary, Merriam Webster, 10th Edition, p. 1052.

* cited by examiner

*Primary Examiner*—Phat X. Cao
(74) *Attorney, Agent, or Firm*—Laleh Jalali

(57) ABSTRACT

An apparatus and method for releasing pressure existing within a package comprising a substrate to which a die is attached to provide electrical connections between the die and the exterior of the package, a lid, and sealant disposed between the substrate and the lid in a pattern with at least one break in the pattern.

6 Claims, 8 Drawing Sheets

WINDOWED PACKAGE FOR ELECTRONIC CIRCUITRY

This application is a division of prior application Ser. No. 09/751,214,filed Dec. 29, 2000.

FIELD OF THE INVENTION

The present invention is related to an apparatus and method for increasing the reliability and performance of an electronic device enclosed within a flip-chip package.

ART BACKGROUND

Commonly available electronic devices exist in the form of a thin sheet of semiconductor material, or die, with electronic circuitry disposed thereon by way of various photolithographic processes. To protect the circuitry from damage, the die is often enclosed in a package designed to facilitate the attachment of the electronic device to a printed circuit board.

Improvements in electrical signal characteristics, as well as increased flexibility in power consumption and die size, have been realized through the use of packages such as the "flip-chip" or "controlled collapsed chip connection" (C4) package which typically integrates a lid made of aluminum or other thermally conductive material that serves as a heatsink (also known as a "heat spreader"), and a substrate made of an organic compound that incorporates electrically conductive materials used to provide electrical connections between the die and a circuitboard to which the package is attached.

FIG. 1 is a cross-sectional of a prior art package of the ball grid array type. The exterior of package 100 is comprised of lid 110 (also known as an integrated heat spreader, or IHS), substrate 112 and sealant 114 disposed between lid 110 and substrate 112. Thermal attach 116 provides a thermally conductive connection between die 130 and lid 110, which serves to aid in cooling die 130 during normal operation of the circuitry disposed on die 130 by emitting heat conducted from die 130 through thermal attach 116 to the ambient air surrounding the exterior of lid 110. Underfill 120 and solder balls 122 (also known as C4 bumps) attach die 130 to substrate 112, with solder balls 122 providing electrical connections between die 130 and substrate 112. Substrate 112 is a printed circuit board with conductors forming electrical connections between solder balls 122 and solder balls 124. Solder balls 124 form electrical connections between substrate 112 and circuitboard 140 when package 100 is attached to circuitboard 140, and thereby, form electrical connections between die 130 and circuitboard 140.

FIG. 2 is a top side view of the same prior art package depicted in FIG. 1, with the items of package 200 of FIG. 2 being labeled with 2xx numbers that correspond to the 1xx numbers of the labeled items of package 100 of FIG. 1. What would have been a lid and thermal attach corresponding to lid 110 and thermal attach 116, respectively, of FIG. 1 have been removed from the package depicted in FIG. 2 to allow the relative position of other items under the lid to be seen. As shown in FIG. 2, the exterior of package 200 is comprised of substrate 212 and sealant 214. Die 230 is substantially centered relative to substrate 212, and is attached to substrate 212 via underfill 220 shown protruding from underneath and just beyond the edges of die 230. Sealant 214 is disposed to correspond to where the lid (not shown) would meet with substrate 212, so as to bond the lid to substrate 212. As shown, sealant 214 is disposed in a manner forming an unbroken line that surrounds die 230.

A drawback to disposing sealant 214 in an unbroken line is that a complete seal is formed between the lid and substrate 212 that can prevent differences in pressure between the interior of package 200 and the ambient air surrounding the exterior of package 200 from being equalized. This becomes especially significant where substrate 212 is made of organic or other material that is susceptible to absorbing moisture from the ambient air surrounding package 200, and then releasing moisture into the interior of package 200. During thermal testing or normal use, when the temperature of die 230 increases, moisture present within the interior of package 200 become steam, causing an increase in pressure within package 200, and tending to push the lid and substrate 212 apart. As can best be appreciated by reviewing FIG. 1, the pushing apart of lid 110 and substrate 112 tends to separate lid 110 from die 130, thereby reducing the pressure normally exerted by lid 110 to squeeze thermal attach 116 against die 130, and thereby reducing the effectiveness of thermal attach 116 in conducting heat away from die 130. This increase of pressure can also cause substrate 112 to bow outward, giving substrate 112 a curved shape that exerts stress on the corners of die 130 which may cause thin film cracking and/or thin film delamination leading to electrical failure and/or decreased lifespan of the circuitry disposed on the surface of the die.

Still another drawback arising from the presence of moisture being converted to steam under pressure, is that steam could be forced between either thermal attach 116 and die 130, or between thermal attach 116 and lid 110. This reduces the contact between thermal attach 116 and either lid 110 or die 130, and thereby also reduces the effectiveness of thermal attach 116 in conducting heat away from die 130 and towards lid 110. Furthermore, depending on the composition of thermal attach 116, steam may also penetrate the thermal attach material, itself, thereby forming gaps within thermal attach 116 which would block the transmission of heat from die 130 through thermal attach 116.

In addition to undesirable effects resulting from a buildup of pressure and the presence of moisture, there are drawbacks arising from the use of an unbroken line of sealant as a result of differences in the rates of expansion and contraction between the lid, the substrate and the die. Referring once again to FIG. 1, as temperature increases, both lid 110 and substrate 112 tend to expand more rapidly than die 130, and at different rates relative to each other, depending on the particular materials used in making lid 110 and substrate 112. An unbroken line of sealant restricts relative movement of lid 110 and substrate 112 more than sealant with a pattern of breaks would, and as a result, either lid 110 or substrate 112 can be caused to bow outwardly. As earlier described, this bowing out effect can either reduce the effectiveness of thermal attach 116 in conducting heat away from die 130, or can cause cracking and/or delamination in die 130.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

The present invention concerns "flip-chip" or "controlled collapsed chip connection" (C4) packages for integrated circuits where an organic substrate is used. Such a package is also known as an "organic land grid array" or OLGA. Particularly, the present invention concerns the use of such packages to hold particularly large dies. However, as those skilled in the art will appreciate, the present invention is also applicable where other porous substrate materials are used, or where smaller dies are used upon which is disposed circuitry that generates considerable amounts of heat. The present invention is also applicable where the package is to be used in high heat environments.

Figure 1:
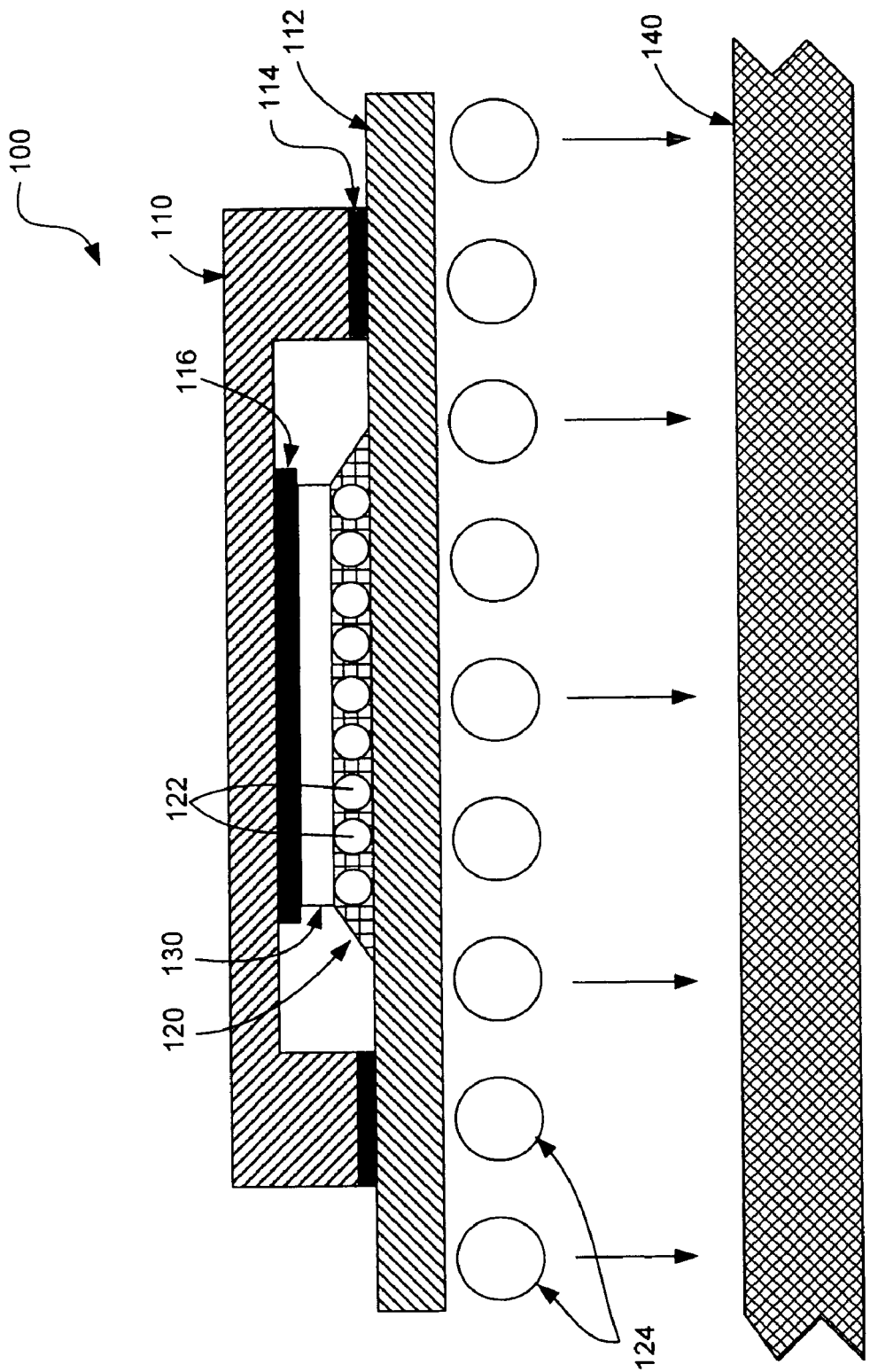
FIG. 1 is a cross-sectional view of a prior art ball grid array package.
Figure 2:
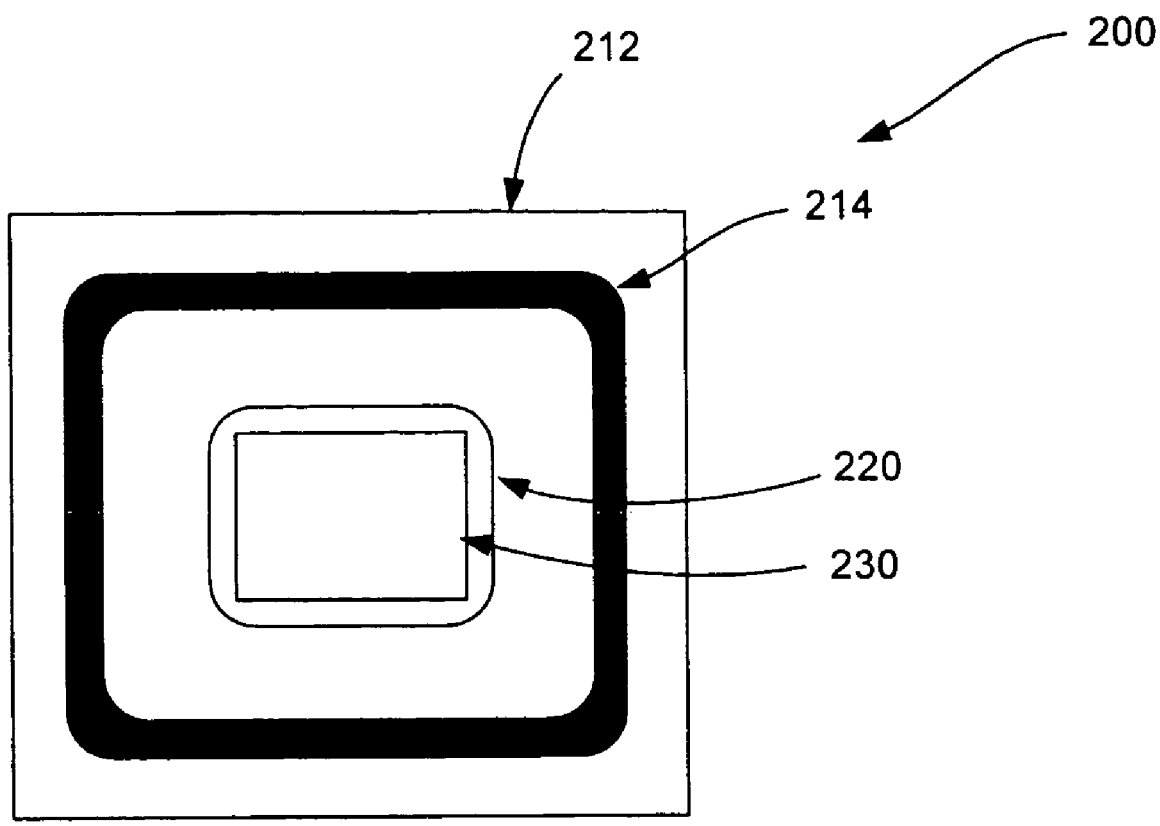
FIG. 2 is a top side view of a prior art ball grid array package with some portions of the package removed.
Figure 3A:
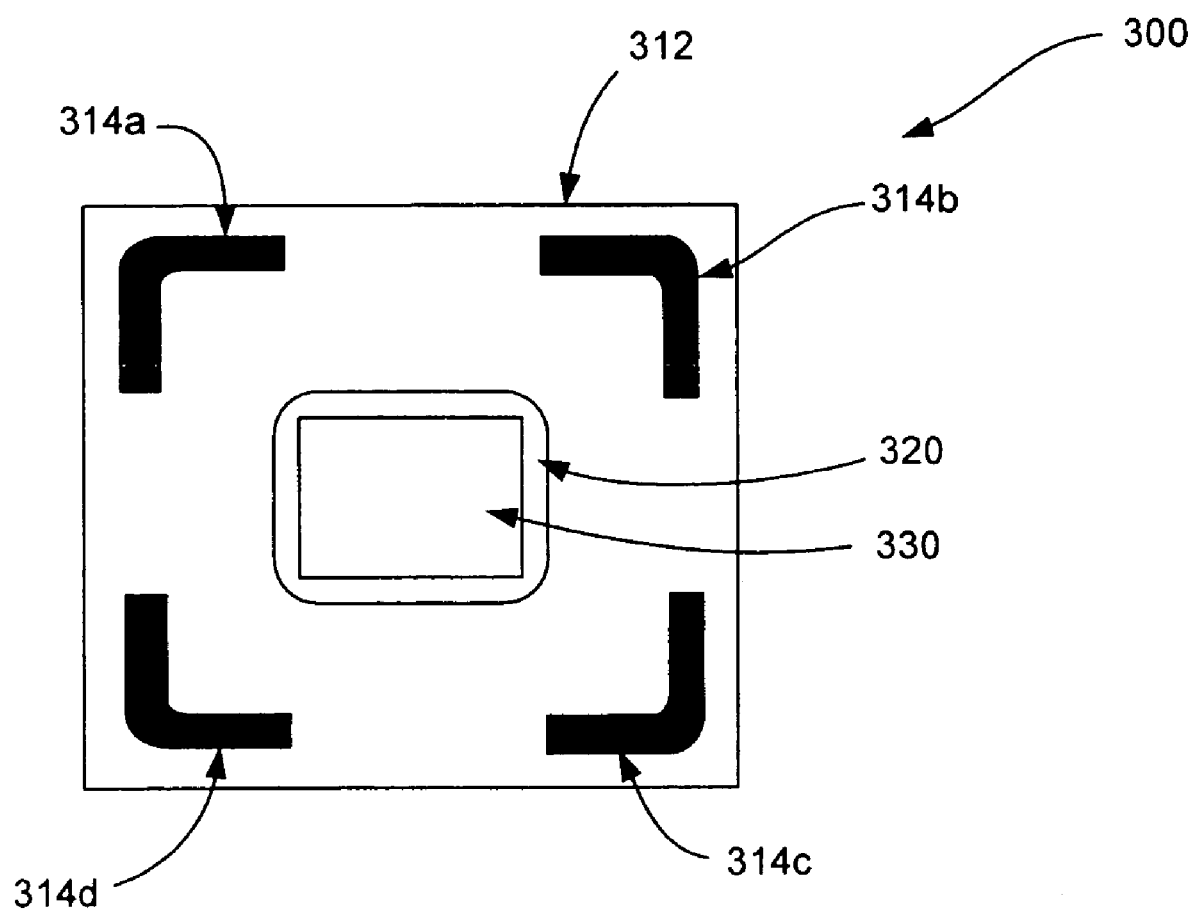
FIG. 3a is a top side view of one embodiment of the present invention with some portions of the package removed.
Figure 3B:
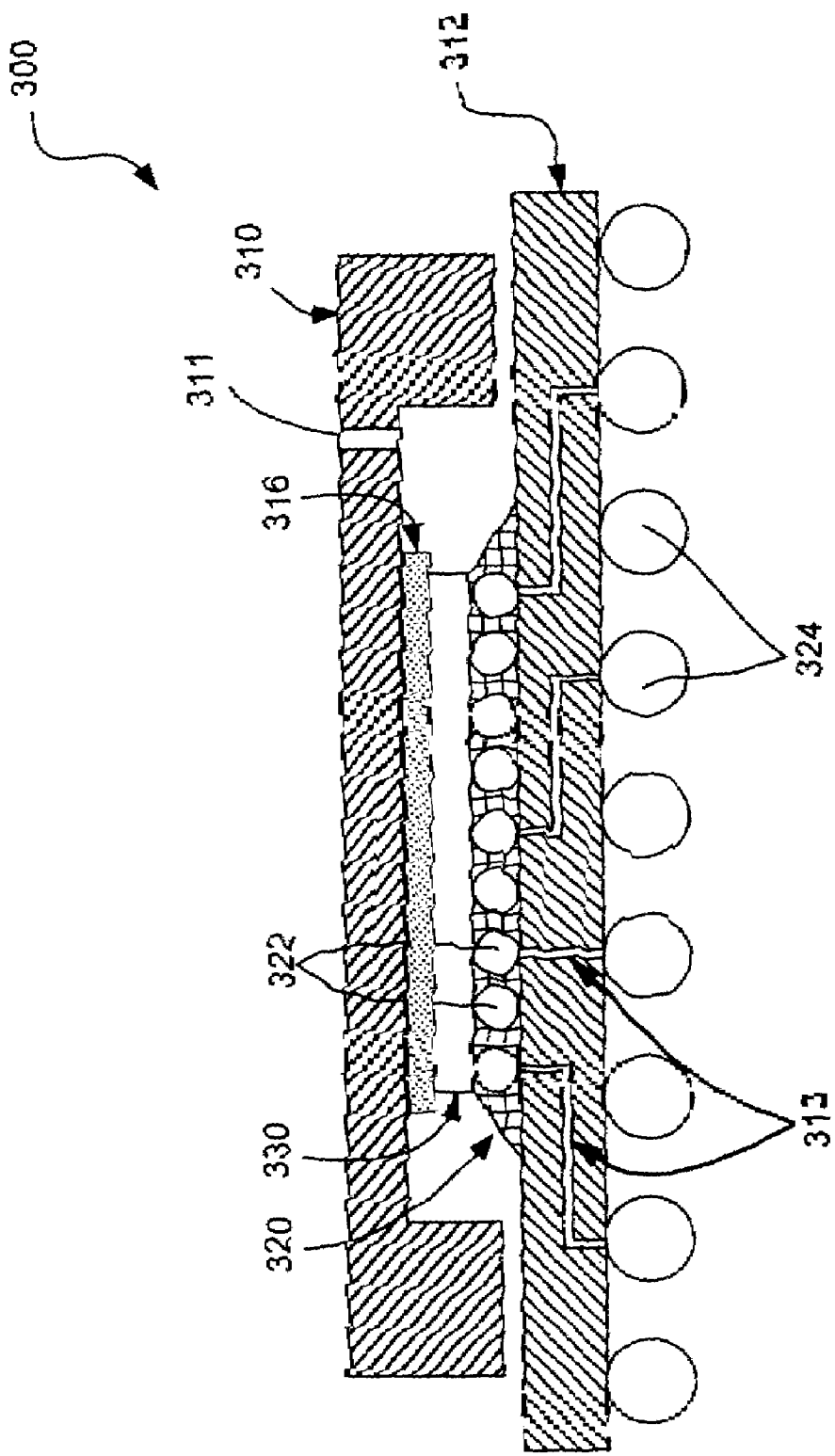
FIGS. 3b–3c are cross-sectional views of one embodiment of the present invention.
Figure 3C:
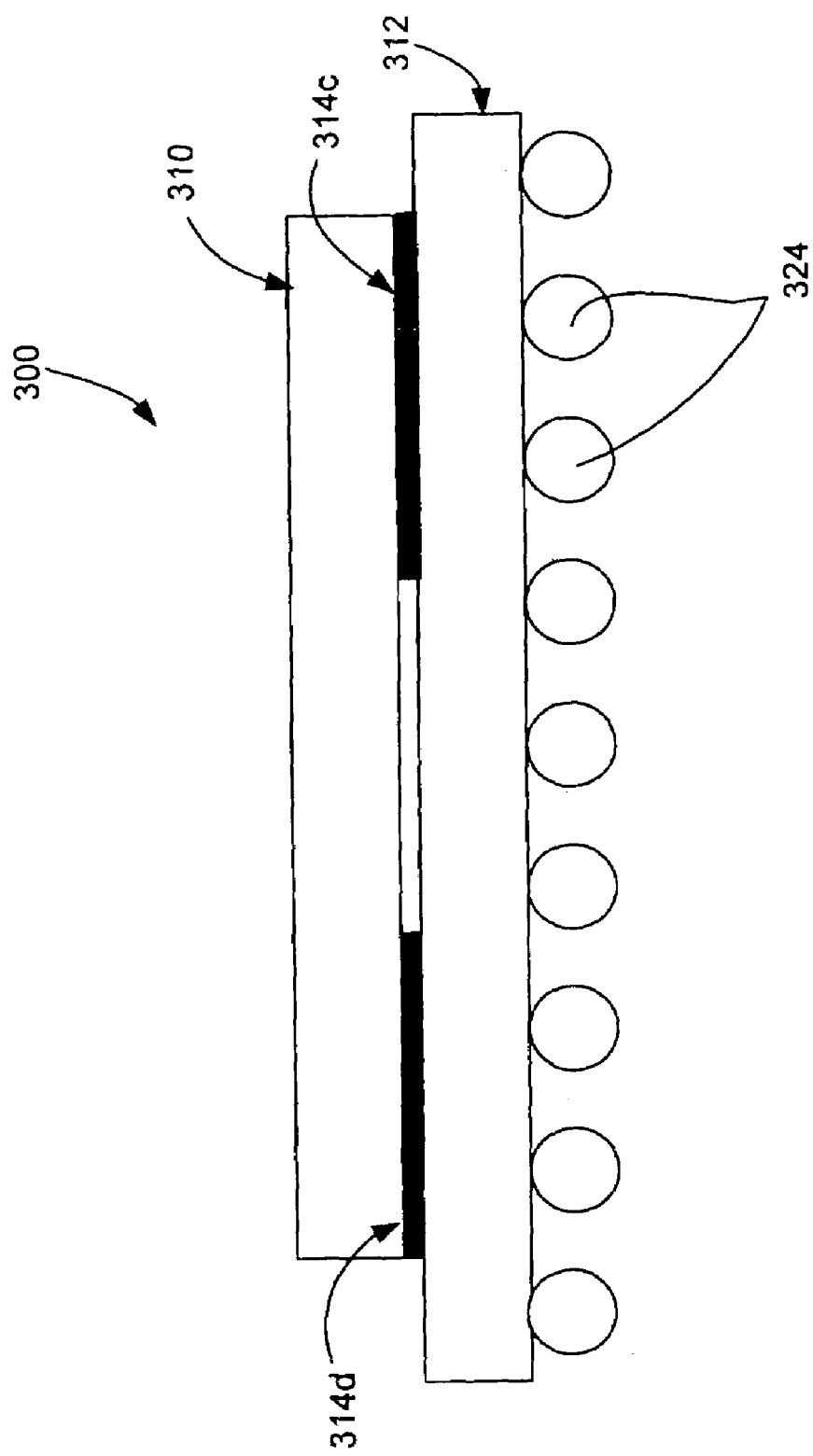

FIG. 3 is a top side view similar to that of FIG. 2, but depicting an embodiment of the present invention. Items of package 300 of FIG. 3 being labeled with 3xx numbers that correspond to the 2xx numbers of the labeled items of package 200 of FIG. 2. Just as with FIG. 2, what would have been a lid and thermal attach corresponding to lid 110 and thermal attach 116, respectively, of FIG. 1 have been removed from the package depicted in FIG. 3 to allow the relative position of other items under the lid to be seen. As depicted in FIG. 3, the exterior of package 300 is comprised of substrate 312 and sealant segments 314a through 314d. Also as shown, die 330 is substantially centered relative to substrate 312, and is attached to substrate 312 via underfill 320 which is shown protruding from underneath and just beyond the edges of die 330.

Like sealant 214 of FIG. 2, the sealant used in the embodiment of FIG. 3 is disposed to correspond to where the lid (not shown) would meet with substrate 312, so as to bond the lid to substrate 312. However, unlike sealant 214 of FIG. 2, the sealant used in this embodiment does not form an unbroken line that surrounds die 330. Instead, the sealant is disposed in four sealant segments 314a–d, leaving breaks between the segments through which pressure that would otherwise build up within the interior of package 300 as a result of moisture being turned to steam when the temperature within the package increases may be released.

Referring variously to both FIGS. 1 and 3, by allowing this release of pressure, the lid (not shown in FIG. 3, but correspondingly shown as lid 110 in FIG. 1) is not caused to be pushed away relative to substrate 112/312. As a result, the pressure exerted by the lid on the thermal attach (not shown in FIG. 3, but correspondingly shown as thermal attach 116 in FIG. 1) that conducts heat away from die 130/330 to the lid is not reduced, and the effectiveness of the thermal attach in conducting away such heat is preserved.

Also, by allowing this release in pressure, substrate 112/312 is not caused to bow outward, thereby causing substrate 112/312 to become curved, and potentially causing cracks to form in die 130/330 in the vicinity of the corners.

Furthermore, disposing sealant 314a–d in a pattern with breaks results in the sealant forming a less rigid connection between lid 110 and substrate 112/312, thereby allowing a degree of relative movement between lid 110 and substrate 112/312. Allowing some degree of relative movement allows lid 110 and substrate 112/312 to expand and contract at different rates relative to each other in response to changes in temperature, thereby reducing the tendency for lid 110 or substrate 112/312 to bow outwardly. This in turn, serves to reduce the earlier described loss in effectiveness of thermal attach 116 and/or the earlier described cracking or delamination in die 130/330.

In one embodiment, the sealant is disposed in multiple segments, resulting in multiple breaks. In another embodiment, the sealant is disposed in a single segment, but not forming a complete loop surrounding die 330, thereby resulting in a single break. In one embodiment, the breaks comprise at least 10% of the total length of what would otherwise be a complete loop of sealant, while in another embodiment, the breaks comprise less than 10% of that length. In still another embodiment, the sealant is disposed in a pattern of small spots or dots of sealant leaving breaks between the spots of sealant, rather than segments defining breaks.

In one embodiment, the sealant is comprised of a relatively flexible material permitting substrate 312 and the lid (not shown) to move relative to each other with a high degree of freedom. In another embodiment, the sealant is comprised of a more rigid material limiting the relative movement of substrate 312 and the lid.

In one embodiment package 300 would be formed by first attaching die 330 to substrate 312, thereby forming physical and electrical connections between die 330 and substrate 312. The sealant would then be disposed on substrate 312 in the four segments 314a–d, where the lid (not shown) is to be attached to substrate 312. Thermal attach (not shown) would then be disposed on die 330, where the lid (not shown) is to be attached to die 330. Then the lid would be attached to substrate 312 (via sealant 314a–d) and die 330 (via the thermal attach). As those skilled in the art will understand, the order in which these occur may be changed without departing from the spirit of the invention.

In one embodiment, package assembly equipment originally designed to dispose sealant in an unbroken line is modified to dispose the sealant as sealant segments 314a–d. In another embodiment, new package assembly equipment specifically designed to dispose the sealant as sealant segments 314a–d is used.

In one embodiment, substrate 312 is comprised of an organic material, and this organic material may be porous such that it is susceptible to absorbing moisture from the ambient air external to package 300. In another embodiment, substrate 312 is comprised of a non-organic material, but a material that still suffers the drawback of absorbing moisture. In one embodiment, the package and/or the die within the package is tested by applying heat to the exterior of the package by exposing the package to steam at high pressure.

As shown in FIG. 3b, in one embodiment, the lid 310 has one or more vent holes 311 formed therethrough, that could also serve to permit the release of pressure within the interior of package 300, but which may be blocked as a result of the manner in which package 300 is installed, either for testing or for normal use. In another embodiment, the lid has no vent-holes formed therethrough, and the breaks between sealant segments 314a –314d are the sole means provided for release of pressure.

In one embodiment, the thermal attach (not shown) is a thermal grease, while in another embodiment, the thermal attach is a thermal adhesive.

In one embodiment, the lid (not shown) is made of material capable of conducting heat away from die 330, such as copper or aluminum. In one embodiment, the lid releases the heat conducted away from die 330 to ambient air surrounding package 300. In another embodiment, the lid conducts the heat to other thermally conductive apparatus with which the lid is in contact, such as a heatsink (or heat spreader), heat pipe, or thermal electric cooler.

In one embodiment, package 300 is a ball grid array package where substrate 312 is attached to a circuitboard (not shown) by way of solderballs corresponding generally to solder balls 124 of FIG. 1. In another embodiment, package 300 is a pin grid array package where substrate 312 is attached to a circuitboard by way of pins, either indirectly through a socket attached to the circuitboard, or directly through holes drilled through the circuitboard.

In one embodiment, circuitry comprising the core logic (e.g., random access memory controller, bus interface, I/O device interface, or timers) of a microcomputer system is disposed on a surface of die 330. In another embodiment, circuitry comprising a central processing unit of a microcomputer system is disposed on a surface of die 330.

Figure 4A:
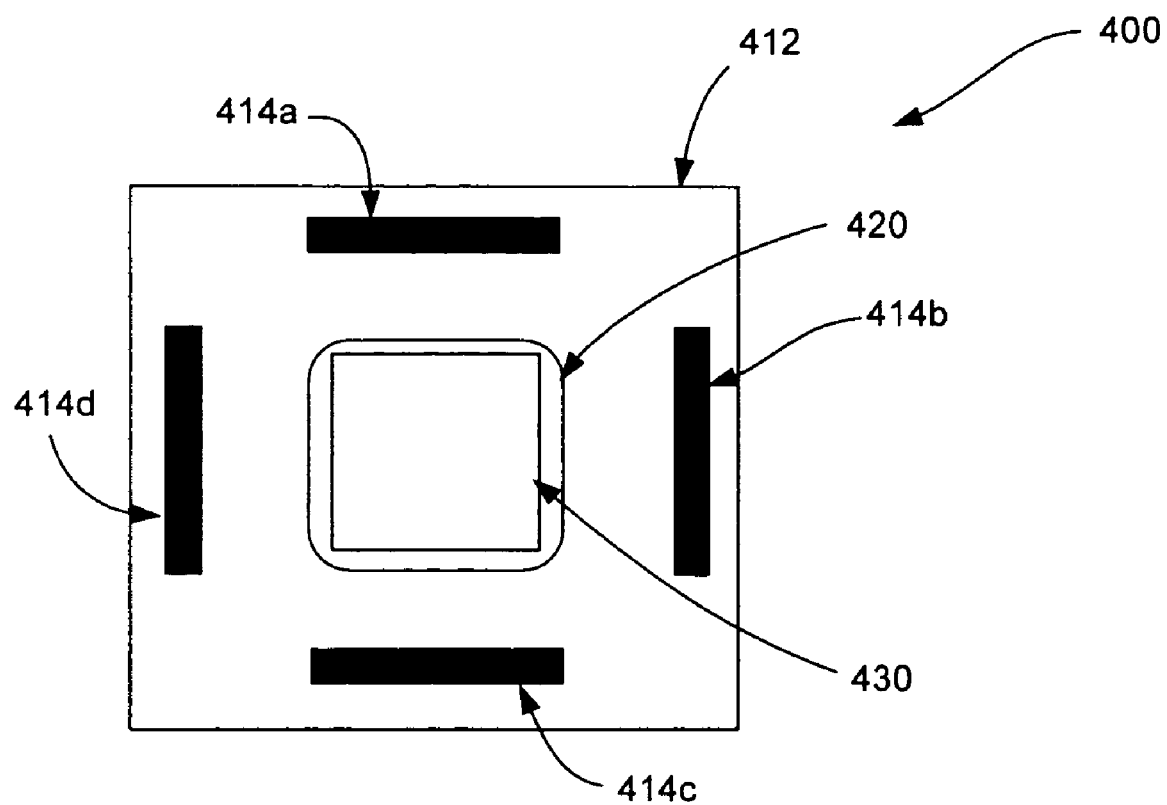
FIG. 4a is a top side view of another embodiment of the present invention with some portions of the package removed.
Figure 4B:
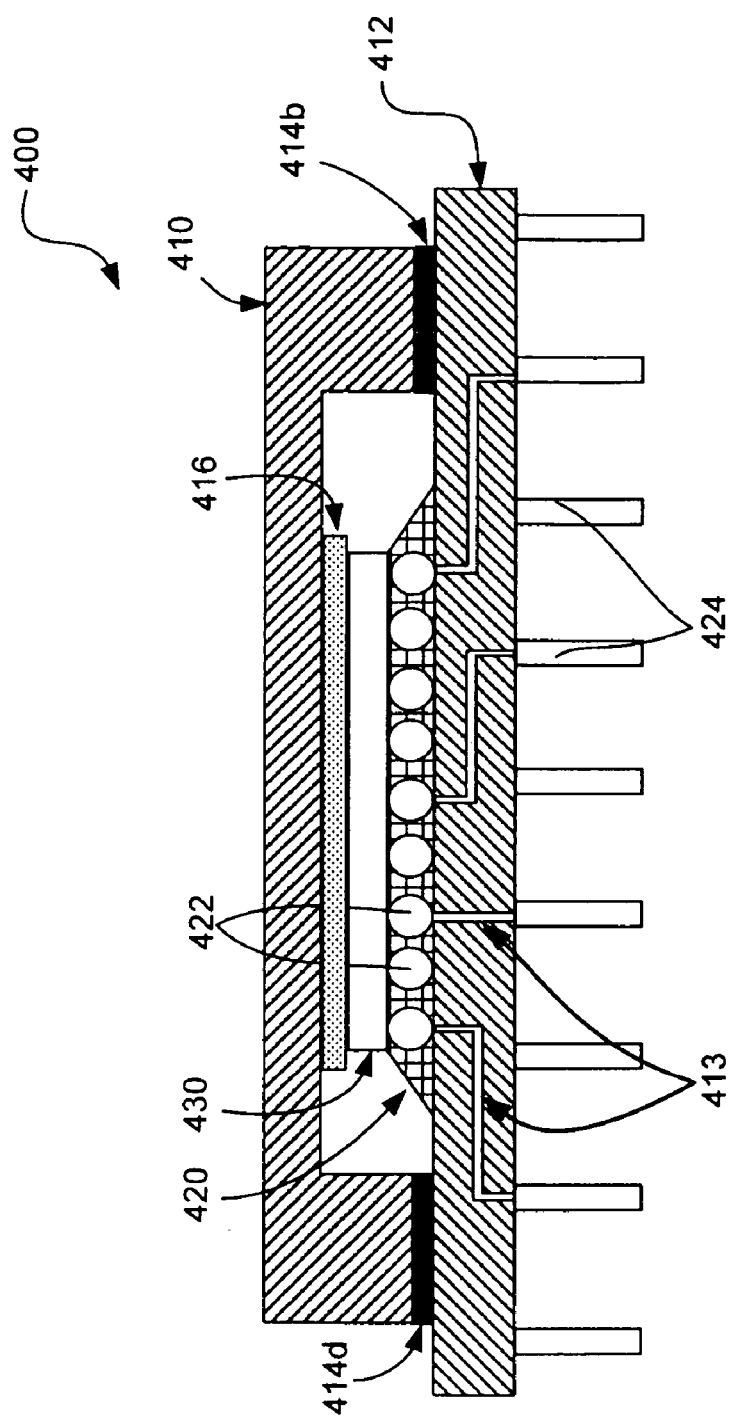
FIGS. 4b–4c are cross-sectional views of another embodiment of the present invention.
Figure 4C:
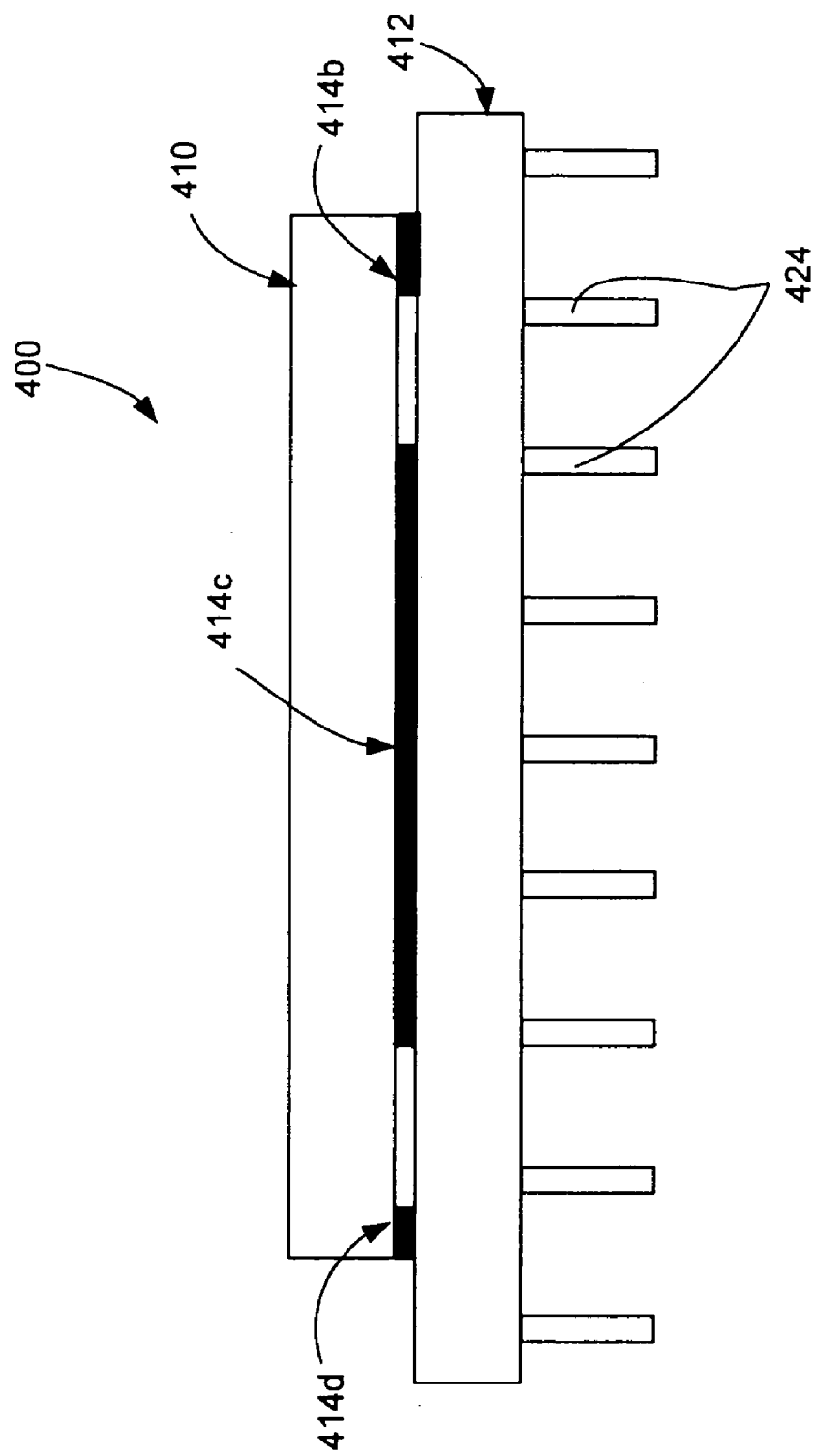

FIG. 4 is a top side view similar to that of FIG. 3, and also depicts an embodiment of the present invention. FIG. 4 is provided to show an alternate pattern by which the sealant may be disposed to correspond to where the lid (not shown) would meet with substrate 412, so as to bond the lid to substrate 412. Although the patterns in both FIGS. 3 and 4 are both substantially rectangular, the breaks in the sealant in package 400 are at the corners of the substantially rectangular pattern, instead of being at the sides as in the case of package 300. Items of package 400 of FIG. 4 being labeled with 4xx numbers that correspond to the 3xx numbers of the labeled items of package 300 of FIG. 3. Just as with FIG. 3, what would have been a lid and thermal attach corresponding to lid 110 and thermal attach 116, respectively, of FIG. 1 have been removed from the package depicted in FIG. 3 to allow the relative position of other items under the lid to be seen.

The invention has been described in conjunction with the preferred embodiment. It is evident that numerous alternatives, modifications, variations and uses will be apparent to those skilled in the art in light of the foregoing description. It will be understood by those skilled in the art, that the present invention may be practiced in support of other combinations of functions in a computer system.

The example embodiments of the present invention are described in the context of ball grid array and pin grid array packages carrying a die on which is disposed electronic circuitry. However, the present invention is applicable to a variety of package types and to a variety of electronic, microelectronic and micromechanical devices. Although the present invention is described in the context of packages attached to rigid printed circuit boards that are commonly in use, the present invention is also applicable to packages being attached to sheets of flexible material or other surfaces providing electrical connections. Also, although the present invention is described in the context of packages with the sealant be disposed in a substantially rectangular pattern, the present invention is applicable to other patterns in which the sealant may disposed, regardless of whether the pattern in which the sealant is disposed is influenced by the shape of the lid and/or the substrate, or not. Indeed, the sealant may be disposed in circular or other polygonal patterns, or the sealant may be disposed as a plurality of spots rather than line segments. Furthermore, although the present invention is described in the context of packages that enclose a single die on which electronic circuitry is disposed, the present invention is applicable to packages enclosing multiple separate dies, and/or dies comprised of smaller dies.

What is claimed is:

1. A method of releasing pressure existing within a package, comprising:
    attaching a die to an inner surface of a substrate to form electrical contacts between the die and the substrate;
    disposing sealant about the inner surface of the substrate in a pattern having at least one break in what would otherwise be a pattern forming an unbroken line surrounding the die;
    and coupling a lid to the substrate, with an inner surface of the lid facing the inner surface of the substrate, using the sealant disposed about the inner surface of the substrate and the lid to bond the lid to the substrate, with the at least one break in the pattern remaining subsequent to the substrate and lid being assembled together to permit a release of pressure with the interior of the package during testing or normal use.

2. The method of claim 1, further comprising disposing thermal attach between the die and the inner surface of the lid to use the lid to conduct heat away from the die.

3. The method of claim 1, further comprising modifying apparatus used to dispose the sealant in a pattern forming an unbroken line to dispose the sealant in the pattern having the at least one break in what would otherwise be a pattern forming an unbroken line.

4. The method of claim 1, wherein the substrate is susceptible to absorbing moisture, and the pressure existing between the substrate and the lid is as a result of moisture being released within the package by the substrate and being converted to steam.

5. The method of claim 1, further comprising installing the package for normal use in a manner that a vent-hole formed through the lid is blocked, thereby preventing the pressure existing within the package from being released through the vent-hole.

6. The method of claim 1, wherein the die is attached to the substrate using a controlled collapsed chip connection.

* * * * *